United States Patent
Jolly

(10) Patent No.: US 7,728,981 B2
(45) Date of Patent: Jun. 1, 2010

(54) DEVICE FOR MEASURING THE PROFILE OF VERY SHORT SINGLE PULSES

(75) Inventor: Alain Jolly, Andernos (FR)

(73) Assignee: Commissariat a l'Energie Atomique, Paris (FR)

( * ) Notice: Subject to any disclaimer, the term of this patent is extended or adjusted under 35 U.S.C. 154(b) by 320 days.

(21) Appl. No.: 11/629,828

(22) PCT Filed: Jun. 13, 2005

(86) PCT No.: PCT/FR2005/050437

§ 371 (c)(1),
(2), (4) Date: Nov. 23, 2007

(87) PCT Pub. No.: WO2006/003338

PCT Pub. Date: Jan. 12, 2006

(65) Prior Publication Data

US 2008/0205883 A1 Aug. 28, 2008

(30) Foreign Application Priority Data

Jun. 15, 2004 (FR) .................................. 04 51277
Jun. 28, 2004 (FR) .................................. 04 51346

(51) Int. Cl.
*G01B 9/02* (2006.01)
(52) U.S. Cl. .................................................... 356/450
(58) Field of Classification Search .......... 356/450–452, 356/484, 121, 122, 213
See application file for complete search history.

(56) References Cited

U.S. PATENT DOCUMENTS

| 5,555,119 | A | 9/1996 | Lewis | 359/158 |
| 6,738,133 | B1 | 5/2004 | Yin | 356/218 |
| 7,450,239 | B2 * | 11/2008 | Uehara et al. | 356/451 |

OTHER PUBLICATIONS

French Search Report, FA 654312 and FR 0451346, 1 pg., (May 6, 2005).
Deng, Kung-Li, et al., "Single-Shot Optical Sampling Oscilloscope for Ultrafast Optical Waveforms" IEEE PhotonicTechnology Letters, IEEE Inc. New York, US, vol. 10, No. 3, (Mar. 1998), pp. 397-399, XP000740683, ISSN: 1041-1135.
Andrekson, Peter A., "Ultrahigh Bandwidth Optical Sampling Oscilloscopes", Tutorial paper, *in OFC Conference proceedings 2004*, Los Angeles (CA); 14 pgs.
Set, Sze Y. et al., "Laser Mode Locking Using a Saturable Absorber Incorporating Carbon Nanotubes", *in J. of Lightwave technology*, 6 pgs, vol. 22, No. 1, p. 51 (Jan. 2004).

(Continued)

*Primary Examiner*—Hwa S. A Lee
(74) *Attorney, Agent, or Firm*—Nixon Peabody LLP

(57) ABSTRACT

A device for measuring the profile of single optical pulses includes an optical fiber loop (1, F) for creating a series of replica pulses (Ri) of the initial optical pulse, starting from the initial optical pulse (I), an automatic gain control (2, 3, 4, AMP) for adjusting the amplitudes of replica pulses (Ri) to values substantially the same as each other, an optical sampler (7, Ech) for forming optical samples (Ei) starting from replica pulses (Ri), and a detector (D) for forming an electrical signal from the optical samples (Ei). The device is applicable to measurement of single optical or electrical pulses or pulses with a low repetition rate.

24 Claims, 11 Drawing Sheets

OTHER PUBLICATIONS

Shirane, Masayuki et al., "A compact Optical Sampling Measurement System Using Mode-locked Laser-diode Modules", *in IEEE Photonic technology Letters*, 3 pgs., vol. 12, No. 11, (Nov. 2000).

Nelson B.P. et al, "Optical Sampling Oscilloscope Using Nonlinear Fibre Loop Mirror", *in Electronics Letter*, (Jan. 31, 1991), 2 pgs., vol. 27, No. 3.

Otani, A. et al., "High Sensitive Optical Sampling Oscilloscope Simultaneous Coverage Of Both C And L Bands", *in Proceedings of OFC 2001*, 2 pgs, paper No. WD6501.

Takara, H. et al., "Eye-diagram Measurement of 100 Gbits/s Optical Signal Using Optical Sampling", *in 22$^{nd}$ European Conf. on optical communication—ECOC 96*, Oslo, paer ThB12, 4 pgs.

Kang, K. Dreyer, "Measurements Via Optical Sampling With a Semiconductor Optical Amplifier-ultrafast Nonlinear Interferometer", *in Proceedings of OFC 2003*. 2 pgs., vol. 1, session WP 4.

Kawanishi, Satoki, "100 Gbits Optical Communication Systems", *in Proceedings of OFC 96 Technical digest*, session WH5, 2 pgs.

Andrekson, P. A., "Picosecond Optical Sampling Using Four-wave Mixing in Fibre", *in Electronics Letters*, 2 pgs., vol. 27, No. 16, (Aug. 1991).

Dorrer, C. et al., "Ultra-sensitive Optical Sampling By Coherent-linear Detection", *in OFC 2001 Postdeadline papers*, 3 pgs.

\* cited by examiner

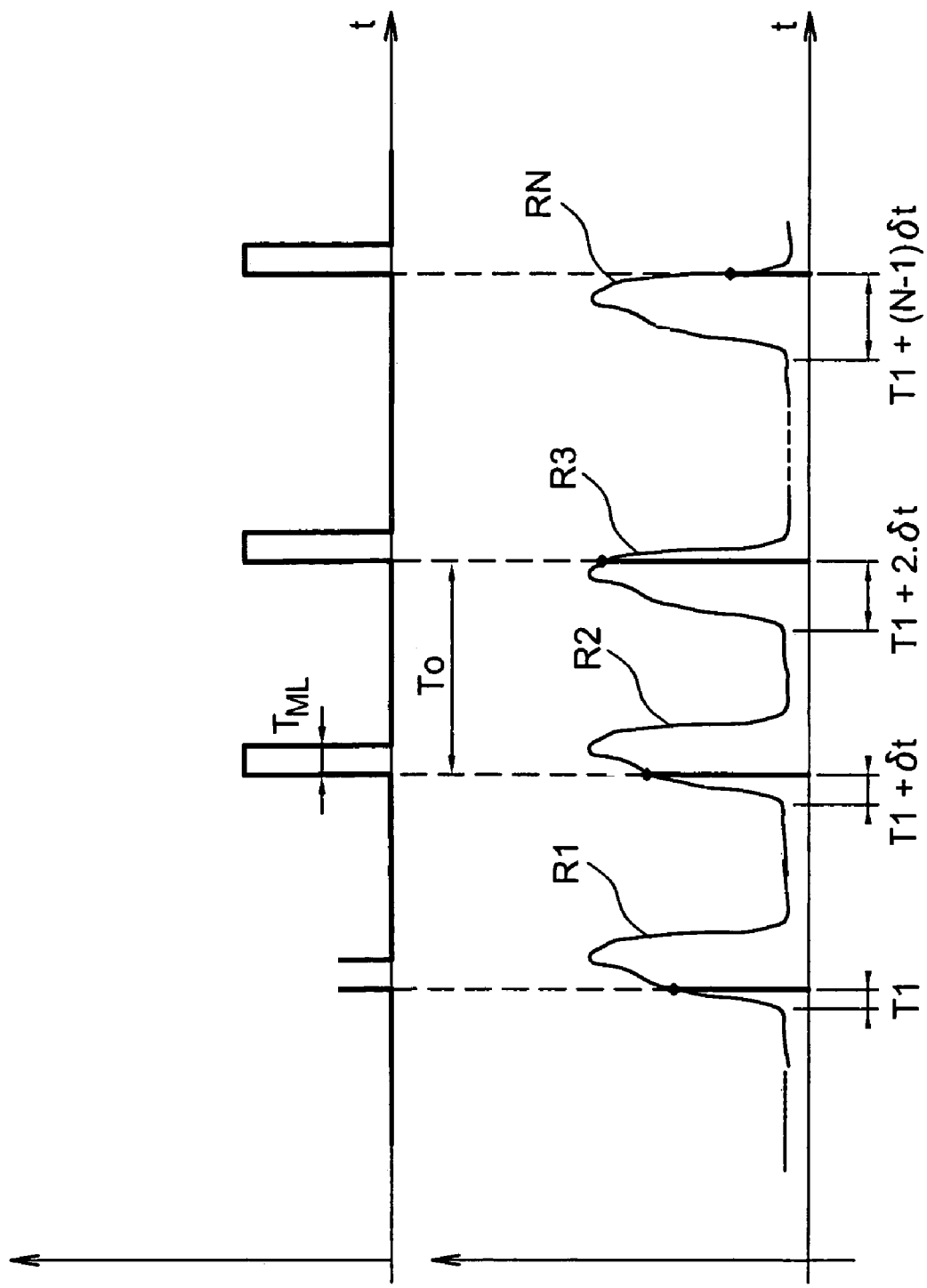

DEVICE FOR MEASURING THE PROFILE OF VERY SHORT SINGLE PULSES

CROSS REFERENCE TO RELATED APPLICATIONS OR PRIORITY CLAIM

This application is a national phase of International Application No. PCT/FR2005/050437 entitled "Pulse Profile Measurement Device", which was filed on Jun. 13, 2005, which was not published in English, and which claims priority of the French Patent Application No. 04 51277 filed Jun. 15, 2004 and French Patent Application No. 04 51346 filed Jun. 28, 2004.

TECHNICAL DOMAIN AND PRIOR ART

The invention relates to a device for measuring the profile of very short single pulses.

The invention is applicable to the measurement of laser pulses with durations between a few picoseconds and a few tens of nanoseconds, in analogue frequency bands typically between 10 GHz and 300 GHz, taking account of the current technology for optical fibres and associated components.

The invention is also applicable to the measurement of single electrical pulses with durations between a few tens of picoseconds and a few tens of nanoseconds, in analogue frequency bands between 10 GHz and 100 GHz, taking account of the current technology of electro-optical modulators.

Advantageously, the invention is also applicable to the measurement of optical and electrical pulses with a low repetition rate.

A measurement of the profile of short single pulses is usually difficult and requires expensive instrumentation. Different types of instruments are used depending on required performances, for example:

electrical oscilloscopes with single samples, for pulses for which the analogue frequency bands typically vary for example from 0 to 7 GHz (the "flash" converters technology is then used), slit streak cameras (SSC cameras) for pulses for which analogue frequency bands typically vary from a few GHz to 100 GHz (the technology used is the same as for electronic vacuum tubes with a linear lateral deflection so that the time axis can be reproduced); slit streak cameras are complex and expensive pieces of equipment that have to be recalibrated frequently, have a low optical sensitivity and a high sensitivity to environmental disturbances, self-correlators for pulses for which typical analogue frequency bands vary from a few hundred GHz to several tens of THz (this equipment actually only supplies a relative measurement of the pulse duration, and the said measurement is obtained taking account of assumptions about the shape of the profile); the non-linear optical technology is used with a time/space conversion coupled to an image analysis and signal processing.

The difference between the measurement device according to the invention and single pulse measurement devices according to prior art is that the measurement device according to the invention is an optimum combination of simple and innovative means that very significantly broaden the analogue frequency bands of measured pulses.

DESCRIPTION OF THE INVENTION

The invention relates to a device for measuring a profile of single optical pulses or a profile with a low repetition rate that includes:

means for creating a series of replica pulses of an initial optical pulse, with period $\tau$, starting from the initial optical pulse, slaving means for adjusting the amplitudes of replica pulses to values substantially the same as each other, means of sampling replica pulses to output optical samples starting from replica pulses, detection means for forming an electrical signal from optical samples output by sampling means, the optical sampling means comprising a laser source that emits laser pulses with frequency 1/To and with a very much shorter duration than the initial optical pulse, the period $\tau$ of the replica pulses and the period To of the laser pulses being related by the relation:

$\tau = To - \delta t$, where $\delta t$ is a time drift with a very significantly shorter duration than the initial optical pulse duration, and an optical sampler illuminated by the replica pulses and by the laser pulses, the optical sampler being made practically transparent to the replica pulses under the effect of the laser pulses.

According to a first variant of the invention, the optical sampler is a Kerr cell that includes an active Kerr effect medium placed between two cross polarisers.

According to a second variant of the invention, the optical sampler comprises:

a divider to divide a replica pulse into a first replica pulse fraction and a second replica pulse fraction, a saturable absorbent comprising a first zone and a second zone, illuminated by the first and second replica pulse fractions respectively, the first zone being made approximately transparent under the effect of pulses from the sampling laser source, and an interferometric optical subtraction device that outputs an optical sample as the result of the difference between a sampled signal output from the first saturable absorbent zone and a signal output from the second saturable absorbent zone.

According to another characteristic of the invention, the measurement device comprises an interferometric device placed at the output from the optical sampler to reduce the width of the optical samples.

According to one preferred embodiment of the invention, the means for creating a series of replica pulses of the initial optical pulse comprise a coupler with four ports and a wave guide, for example a single mode optical fibre, looped back on the coupler.

The invention also relates to a device for measuring the profile of single electrical pulses or pulses with a low repetition rate, characterised in that it comprises an electro-optical modulator in series with a device for measuring the profile of optical pulses according to the invention.

The device for measuring optical pulses according to the invention covers frequency bands that are still not possible with known oscilloscopes that measure single optical pulses. The only way of obtaining frequencies around 100 GHz is to use SSC cameras, but the coding range is very much lower than 8 bits and this range is made possible using the device according to the invention.

The pulse measurement device according to the invention has an extended coding range associated with a very high resolution in time, by construction. The range is limited essentially by the noise factor of the slaving loop and by the output optical/electrical conversion. The instrument transfer function uses a saturable process, which maintains optimum stability. This is not the case for non-linear "parametric amplification" or "optical frequency conversion" type conversion mechanisms, or in the "self correlator" type configuration.

The measurement sensitivity obtained with the invention is very high. A sensitivity several decades better than the sensitivity of SSC cameras can be obtained, for an identical time resolution. The performances of the device according to the invention can also be advantageously compared with the performances of self-correlators, in which the non-linear optical conversion process is incompatible with the conversion of low speed optical signals.

Use of the device according to the invention with a fibre loop coupled to a saturable absorbent has the advantage that it is technologically very simple and has a very small number of active components. One consequence of this simplicity regarding possible performances is that it can be made at low cost. In this respect, a very advantageous comparison can be made with "all optical" oscilloscopes for applications in the Telecommunications field and with SSC cameras. Consequently, signal processing and calibration needs that are indispensable for interpretation of measurements, are reduced. The device according to the invention has an important advantage in terms of use, considering constraints on the use of an SSC camera for which a periodic re-calibration is essential.

The device according to the invention is particularly robust. All critical optical components of the sampling function are preferably made of fibre, derived from proven technologies from the telecommunications and laser sectors. Similarly, the electronic part on the output side of the device is composed of components that are specified in frequency bands well below the high analogue frequencies of the optical part. For example, the fastest components are the electrical/optical conversion photodiodes, that naturally operate in integrator mode and for which the response time simply needs to remain less than τ.

In the case of the electrical pulse measurement, the device according to the invention advantageously enables an analysis of pulse profiles within a wide frequency range. Despite the reduction in the analogue pass band resulting from inserting an input electro-optical converter, the electrical pulse measurement device according to the invention has very much better performances than known equipment, for example such as SSC cameras for which the coding range is very limited when they are used on their fastest time bases.

The basic concept of the measurement device according to the invention is very flexible and variable since it can be adapted to a wide range of compromises to be optimised regarding the required measurement performances.

BRIEF DESCRIPTION OF THE FIGURES

Other characteristics and advantages of the invention will become clearer after reading a preferred embodiment of the invention with reference to the attached Figures among which:

FIGS. 2A-2D show time diagrams illustrating operation of the measurement device shown in FIG. 1;

The same marks denote the same elements in all the Figures.

DETAILED DESCRIPTION OF EMBODIMENTS OF THE INVENTION

Figure 1:
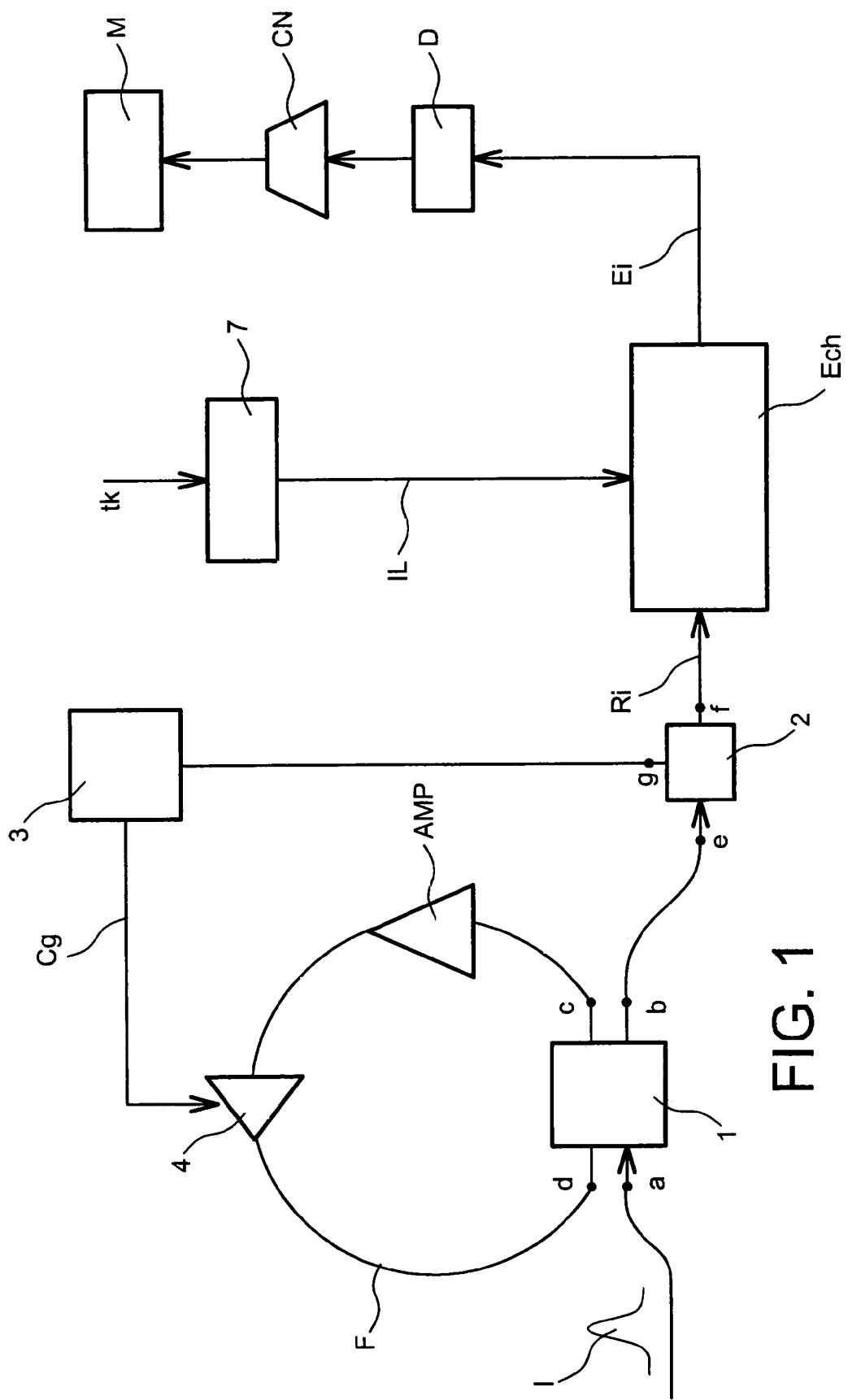
FIG. 1 shows a device for measuring single optical pulses according to the invention.

FIG. 1 shows a device for measuring an optical pulse according to the preferred embodiment of the invention.

The device comprises a coupler with four ports 1, a single mode optical fibre F, a three-port coupler 2, a control circuit 3, an isolated amplifier (single directional amplification) AMP, an electronically controllable electro-optical attenuator 4 (periodic control) in series with the amplifier AMP, a source 7 of recurrent and very short duration laser pulses, an optical sampler Ech, a detector D, an analogue/digital converter CN and a memory M. In the case shown in FIG. 1, the sampler Ech operates in "transmission" mode. However, it should be noted that the invention is also applicable to another embodiment in which the sampler ECH works in "reflection" mode.

The optical fibre F with length L is of the single mode type to avoid mode dispersion effects from occurring that would broaden the pulse signals that propagate. The coupler 1 has four ports a, b, c, d. Port a forms the input to the measurement device, port b is connected to the input to the three-port coupler 2, port c is connected to the input of the amplifier AMP through a first segment of the fibre F and port d is connected to the output from the attenuator 4 through a second segment of the fibre F.

The four-port coupler 1 is a directional coupler that operates as follows:

a fraction α% (for example 5%) of a signal input on port a is transmitted to port b, and the remaining fraction equal to (1−α) % (for example 95%) is transmitted to port c, and a fraction α% of a signal input on port d is transmitted to port b, and the remaining fraction equal to (1−α)% is transmitted to port c.

Consequently, an initial laser pulse I input into the measurement device through port a of coupler 1 is split into a first pulse fraction (α%) output on port b and a second pulse fraction ((1−α)%) output on port c. The first pulse fraction is sent to coupler 2 and the second pulse fraction is looped back through fibre F, the amplifier AMP and the attenuator 4, to port d of coupler 1. The propagation speed V of the second pulse fraction on fibre F with length L defines a loop time τ such that:

$$\tau = L/v$$

When it penetrates into port d, the second pulse fraction thus looped back is itself divided into a third pulse fraction (α%) output on port b towards coupler 2, and a fourth pulse fraction ((1−α)%) looped back on port d. Thus each time that a pulse fraction is looped back, the coupler 1 returns a fraction α% of the power that it receives on output port b and a fraction (1−α)% on port c.

An initial laser pulse input into the measurement device through port a of coupler 1 thus originates a series of replica pulses of the initial pulse separated from each other by the duration τ. The transmission rate of the attenuator 4 and the gain G of the amplifier AMP that are located in the loop are dynamically adjusted to compensate for coupling losses, such that the quantity α×G is typically between 0.95 and 1 (0.9<α× G<1). A calibration coefficient used after the analogue-digital conversion electronically resets the amplitude of all replicas such that the following elementary condition is then satisfied:

$$\alpha \times G \approx 1 \qquad (1)$$

The above relation (1) is obtained using a digital slave loop. To achieve this, a fraction of each replica is sampled using coupler 2. The coupler 2 is a coupler with three ports e, f, and g. Port e is connected to port b of the coupler 1, port f is connected to the input to the divider 5 and port g is connected to the input to the control circuit 3. A signal input into the coupler 2 through port e is divided into a first fraction output on port g and a second fraction output on port f. The fraction output onto port g may for example be equal to 3% of the signal input on port e. This first signal fraction forms the input signal to the control circuit 3. The control circuit 3 evaluates the amplitude of the signal fraction that its receives on its input and consequently outputs an attenuation command Cg that is applied to the attenuator 4 to provide a loop gain typically between 0.95 and 1, such that amplitudes of all replicas remain similar.

Pulses collected on the output port f of the coupler 2 then form a series of replica pulses Ri (i=1, 2, . . . , N) with period τ. The replica pulses Ri are transmitted to the input to the optical sampler Ech that samples them under the action of laser pulses IL output by the laser pulse source 7. The laser pulse source 7 is preferably a mode blocking source that outputs laser pulses with period To and with a duration $R_{ML}$ very much less than τ ($R_{ML} \ll \tau$).

FIGS. 2A-2D show time diagrams illustrating sampling of replica pulses.

FIG. 2A shows pulses with width $T_{ML}$ and period To output by the laser source 7.

FIG. 2B shows a sequence of replicas R1, R2, R3, . . . , RN sampled based on pulses shown in FIG. 2A. The first replica R1 is sampled at a first position in time T1, the position in time T1 measuring a duration that separates an instant that marks the beginning of the replica R1 and the sampling instant. Replicas Ri with rank i greater than 1 (i>1) are sampled at the corresponding positions in time T1+(I−1)δt. Thus, the sampling instant is progressively incremented by the quantity δt inside the profile of successive replicas. This sampling principle is similar to the principle of electronic sequential sampling used for recurrent pulses. However, the configuration used in the framework of the optical pulse measurement according to the invention is very different from that used in the framework of measuring recurrent electrical pulses. The process according to the invention has the advantage that it reproduces a genuine pulse profile rather than a profile averaged in time as is the case for the measurement of recurrent electrical pulses.

Figures 2C, 2D:
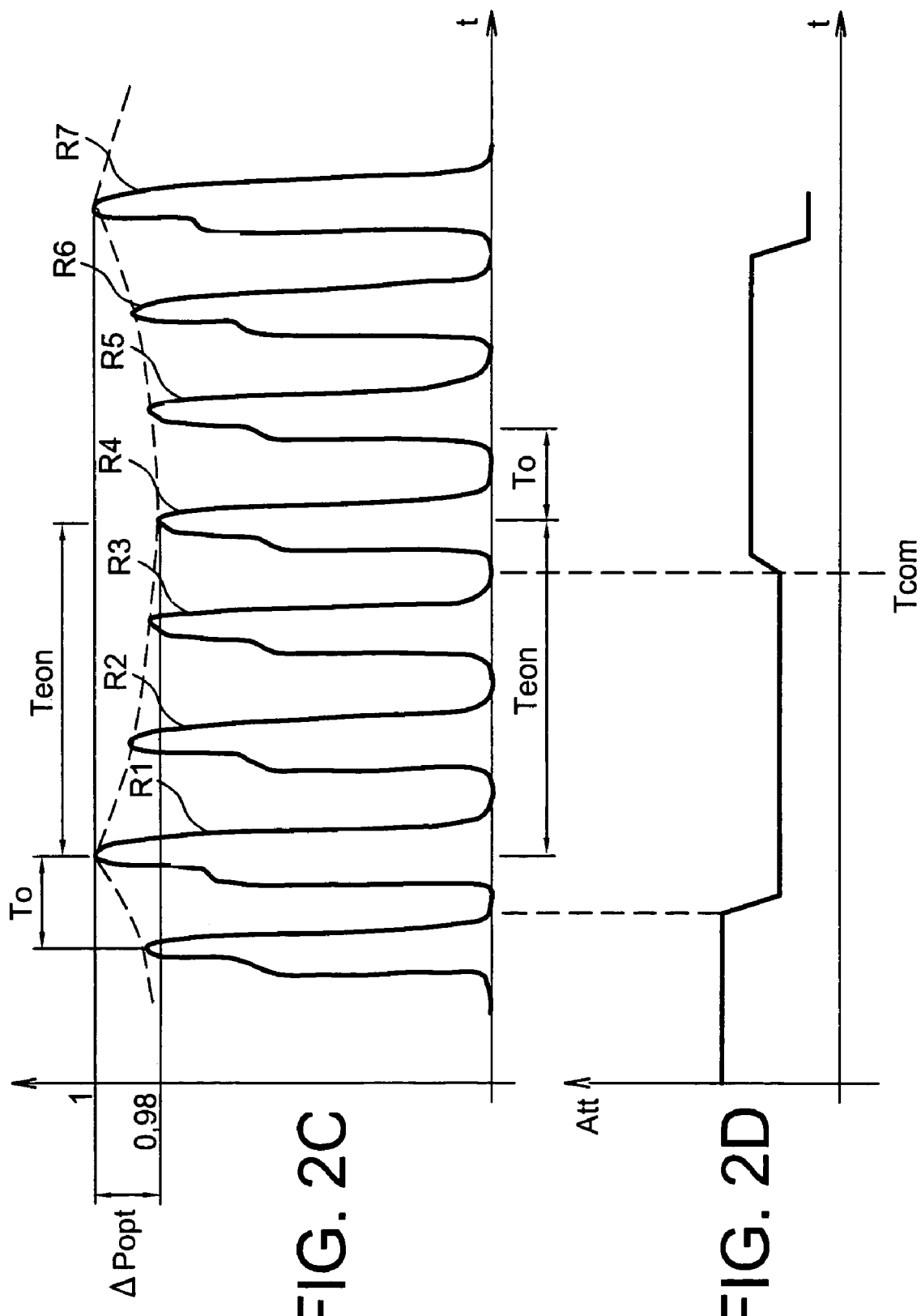

FIG. 2C shows an example of a succession of replicas for which the envelope describes the variation of peak intensities of replicas with time, in the special case in which the slaving electronics periodically activates the attenuator 4. In this example, the slaving period Teon is equal to three times the period To. In this case, peak intensity variations ΔPopt are less than 10% and are periodic. Variations of the envelope within a given period Teon are determined by the value of α×G, and are in exponential form for a constant value α×<1. Operation of the system at the end of the next slaving period is such that the peak intensity of replica R7 is the same value as the peak intensity of replica R1 in the previous slaving period. Thus a calibration coefficient is associated with each replica R1-R7, and taking account of this calibration factor after the analogue-digital conversion provides means of returning to the equivalent condition (1).

FIG. 2D shows the variation of the attenuation value att (ratio of the signal level at the attenuator output to the signal level at the attenuator input) controlled by electronic slaving through the control Cg. Attenuation is constant over a period To and is switched to a different value during the next period, so that the loss of intensity ΔPopt is compensated precisely.

Other slaving operating modes are also possible and will not be described in detail here.

The samples Ei (i=1, 2, . . . , N) output by the optical sampler Ech are transmitted to a detector D, for example a photodiode. For example, the detector D can operate in analogue frequency bands between 10 GHz and 60 GHz, as is now possible with telecommunications technologies. The optical/electrical conversion used by the detector D works in integrator mode. Integrator mode consists of considering that the amplitude of a given optical sample is equal to the value of the electrical response of the detector integrated over time. In this case, the only errors made and that may need to be corrected are errors resulting from detector de-saturation effects, offset of the base line induced by the effect of stacking successive electrical pulses, etc.

The detector D outputs electrical samples transmitted to the analogue-digital converter CN that codes the level of signals that it receives. For example, coding may be done on 8 or 10 bits. The coding time is not critical. It is limited simply by the value of τ. The digital data output by the analogue-digital converter CN are then transmitted to the memory M for which the access time is equal to at least τ.

Figure 3:
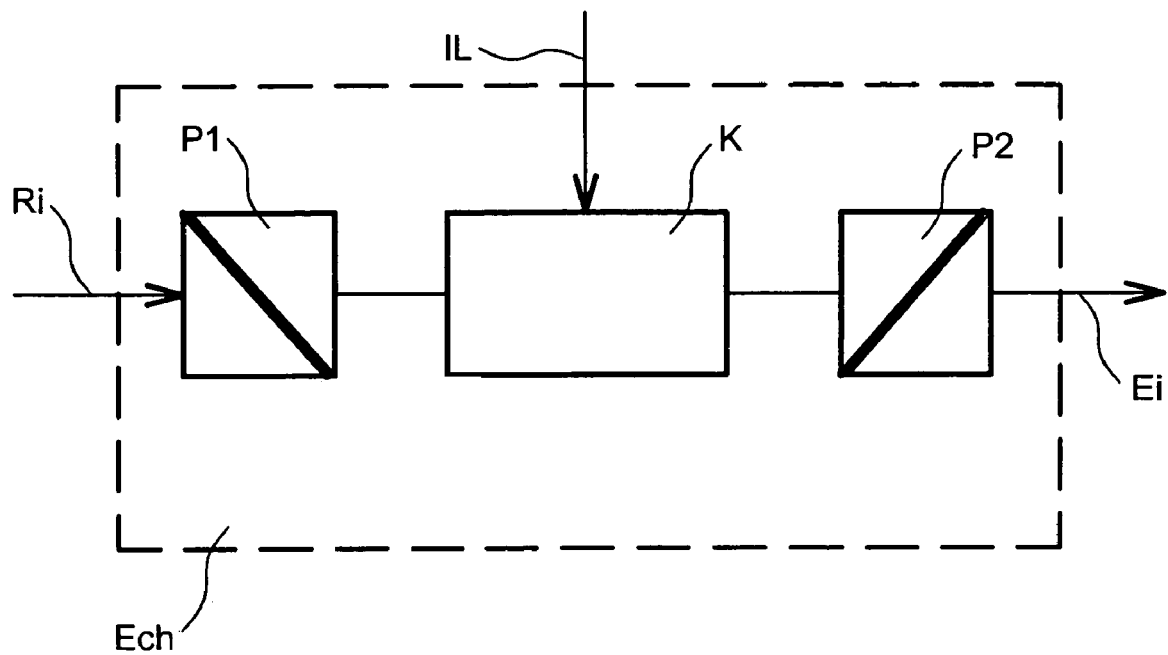
FIG. 3 shows a first variant of a particular circuit of the measurement device according to the invention.

FIG. 3 shows the optical sampler Ech according to a first variant of the invention.

The optical sampler Ech is a Kerr cell. The Kerr cell comprises an active Kerr effect medium K placed between two cross polarisers P1, P2. When a laser pulse IL output by the source 7 is applied, the medium K has sufficient transient birefringence to make the device change from a non-conducting state (non-depolarising medium placed between two cross polarisers) to a conducting state (transmission of the optical polarisation component in the plane of the output polariser).

The optical sampler in the form of a Kerr cell has excellent resolution in time. It is possible to output optical samples with a width of the order of two hundred femtoseconds.

For example, the Kerr effect active medium may be a $CS_2$ type liquid requiring packaging in a sealed chamber. The Kerr effect active medium may also be a solid glass-based medium that then requires a greater laser intensity at the output from the source 7.

Figure 4:
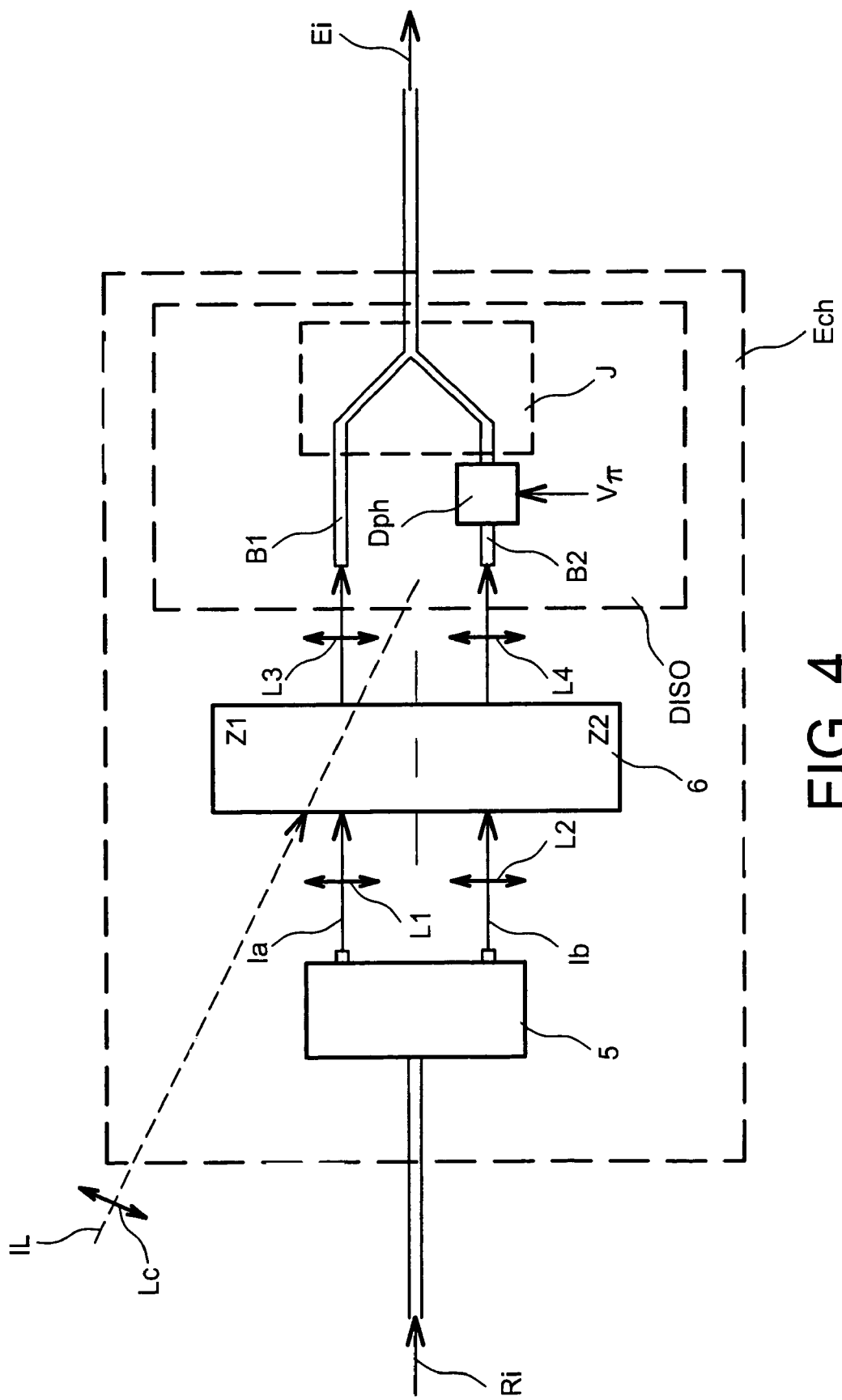
FIG. 4 shows a second variant of the particular circuit for which a first variant is shown in FIG. 3.

FIG. 4 shows the optical sampler Ech according to a second variant of the invention.

The sampler Ech then comprises a divider by two 5, a fast saturable absorbent 6, an interferometric optical subtraction device DISO and collimation lenses L1, L2, L3 and L4. The interferometric optical subtraction device DISO comprises two input arms B1, B2, the arm B2 being provided with a phase shifter Dph, and a recombination junction J with two inputs and one output. The input and the output of the sampler are the input to the divider by two 5 and the output from the junction J, respectively. The arms B1 and B2 and the junction J are made using any type of optical waveguide, for example optical fibres.

A replica pulse Ri received at the input to the sampler Ech is divided into a first pulse fraction Ia and a second pulse fraction Ib with amplitude substantially identical to the amplitude of the pulse fraction Ia. The first pulse fraction Ia is transmitted to a first zone Z1 of the saturable absorbent through a first collimation lens L1 and the second pulse fraction Ib is transmitted to a second zone Z2 of the saturable absorbent through a second collimation lens L2.

The functioning of a saturable absorbent is based on the absorption saturation phenomenon. Low intensity signals that pass through a saturable absorbent are subject to intrinsic absorption of the absorbent medium and consequently are partially absorbed. On the other hand, high intensity signals whiten the absorbent medium through which they pass through until absorption of the medium is reduced to a value significantly lower than the initial absorption value. High intensity signals can then be transmitted partially.

Mathematically, the transfer characteristic of a saturable absorbent is expressed by the following relation:

$$A(\Phi) = \frac{A_o}{1 + \frac{\Phi}{\Phi_{sat}}} \quad (3)$$

where $A(\Phi)$ is the absorption coefficient of the absorbent as a function of the intensity $\Phi$ of the signal that illuminates the absorbent, Ao is the attenuation coefficient of the absorbent in the lack of illumination, and $\Phi_{sat}$ is the natural saturation intensity of the absorbent ($W/cm^2$).

In the context of the invention, zone Z1 is illuminated by pulse fractions Ia and by pulses IL while the zone Z2 is illuminated by pulse fractions Ib only. The peak power $P_{ML}$ of pulses IL output from the laser source with mode blocking 7 (SML source) is chosen to fully or at least very significantly saturate transmission of the absorbent during durations $T_{ML}$ of laser pulses output by the source 7. The beam of pulses IL and the beam of pulse fractions Ia are not collinear. The beam of pulses IL is collimated on the saturable absorbent zone Z1 through a collimation lens Lc, along an axis offset by a few degrees to several tens of degrees from the axis along which the beam of pulse fractions Ia is collimated. The signal collected at the output from zone Z1 and that is collimated through the collimation lens L3 onto the input to arm B1, is then composed only of the pulse fractions Ia that pass through zone Z1.

For a pulse fraction Ia that penetrates into zone Z1, zone Z1 behaves like a sampling gate that works at the frequency Fo of the laser source with mode blocking (Fo=1/To). The opening time $T_{ech}$ of the sampling gate is equal to substantially the overlap time $T_{sat}$ of the saturable absorbent. The duration of the overlap time $T_{sat}$ is longer than the pulse duration $T_{ML}$.

The magnitudes τ and To are related such that:

$$\tau = (To - \delta t) \quad (2)$$

where δt shows the time drift of the sampling instant between two loop turns (see FIG. 2B). The sampling rate of the measurement device is then equal to δt that is greater than or equal to $T_{sat}$, but which is very much less than the duration $T_I$ of the input pulse. The maximum number of samples that can be acquired is N, such that:

$$N = \tau/\delta t \quad (3)$$

The number N can also be written as follows:

$$N = 1/((To/\tau) - 1) \quad (4)$$

The saturable absorbent according to the invention may be made using several different technologies. A liquid solution based on colouring agents in a solid matrix, or a solid saturable absorbent based on carbon nano tubes or semi-conductors, could be envisaged. The fastest solid absorbents of this type used at the moment have overlap times $T_{sat}$ of the order of 1 to 5 picoseconds. Furthermore, the saturable absorbent is preferably chosen to be spectrally compatible with optical operation within the near infrared that is a frequency band useful for neodymium, ytterbium or erbium-based lasers.

While zone Z1 behaves like a sampling gate, zone Z2 has an absorption with a coefficient Ao. The signal output by zone Z2 is transmitted to the input to arm B2 through the collimation lens L4.

Figure 5A:
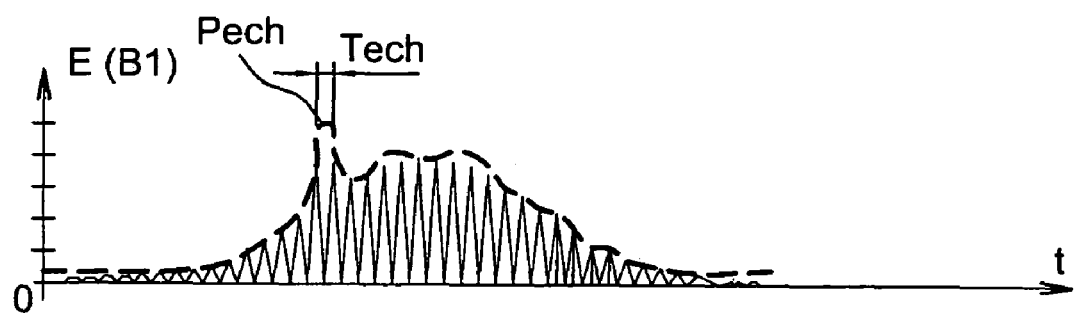
FIGS. 5A-5C show time diagrams illustrating operation of the circuit shown in FIG. 4.
Figure 5B:
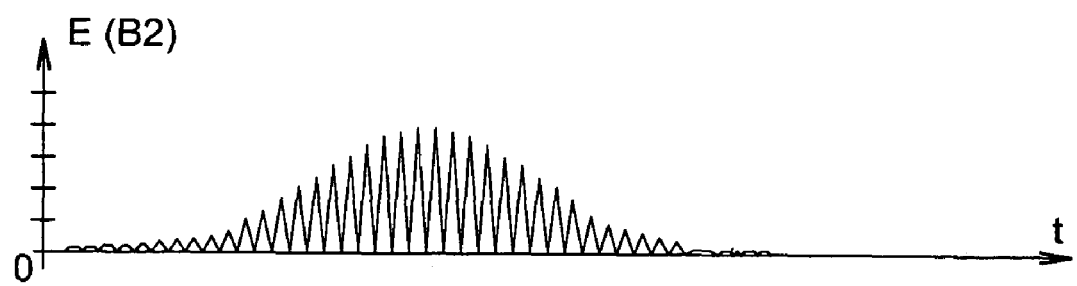

FIG. 5A shows the sampled signal E(B1) collected at the output from zone Z1 and FIG. 5B shows the signal E(B2) collected at the output from zone Z2. The signal E(B1) includes a sampling peak $P_{ech}$ with width $T_{ech}$ within a signal that reproduces the pulse fraction Ia, while attenuating it. The signal E(B2) reproduces the pulse fraction Ib, while attenuating it.

Figure 5C:
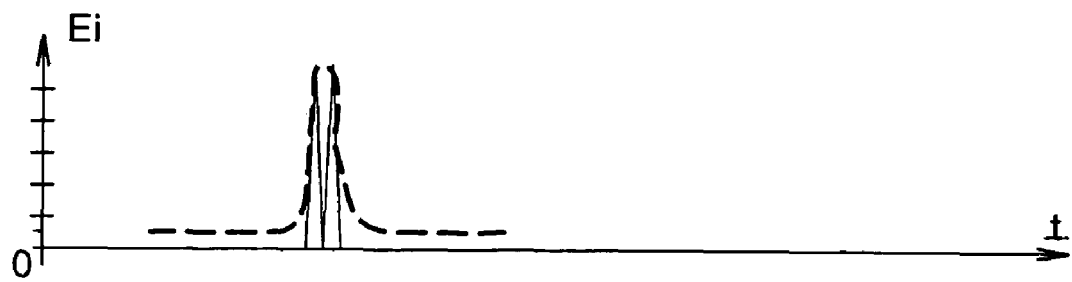

The arm B2 is equipped with a voltage-controlled phase shifter Dph. The voltage $V_n$ applied to the phase shifter Dph is adjusted such that the optical signal output from the arm B1 is in phase opposition to the signal output from arm B2. The junction J that summates the signals output by arms B1 and B2 then outputs a sample Ei with width $T_{ech}$ (see FIG. 5C).

Figure 6:
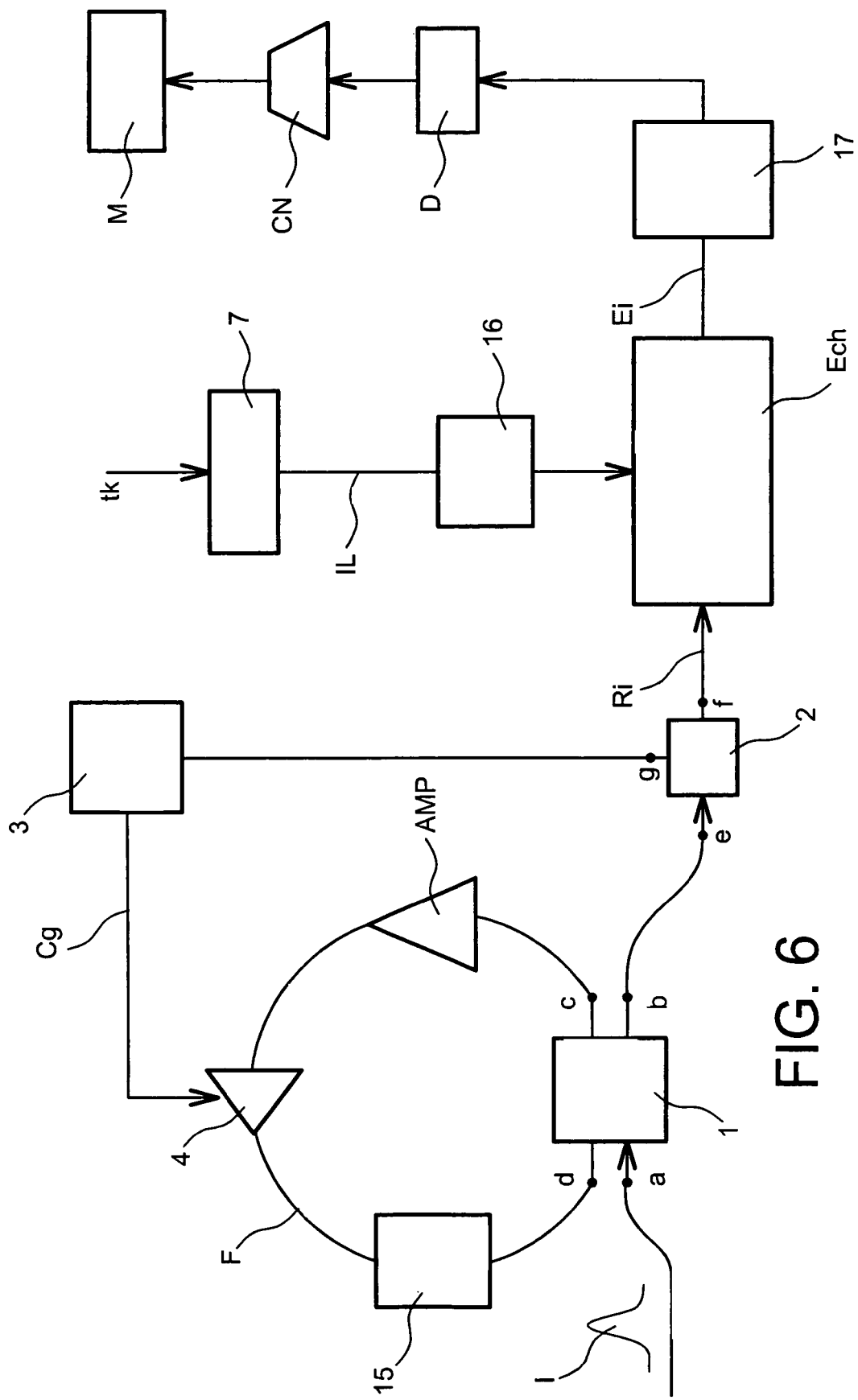
FIG. 6 shows an improvement to the measurement device shown in FIG. 1.

FIG. 6 shows an improvement to the measurement device shown in FIG. 1. The improvement of the invention is thus equally applicable to the case of the first variant and to the case of the second variant.

In addition to the elements shown in FIG. 1, the measurement device includes a dispersion compensator 15, an optical window 16 and an interferometric reshaping device 17. The three devices 15, 16 and 17 are shown in the same Figure for convenience reasons. In fact, the devices 15, 16 and 17 are independent of each other and may be integrated into the measurement device together or separately.

The compensator 15 is inserted into the loop between the output from the attenuator 4 and the port d to the coupler 1. Its function is to compensate for loop chromatic dispersion effects which would otherwise cause deformation of the propagating pulse. For example, the compensator 15 may be a chirped Bragg network device or a fibre segment for which the dispersion coefficient is opposed to the dispersion coefficient of the other components that form the loop.

The optical window 16 is placed between the source 7 of pulses IL and the sampler Ech. It defines an elementary sampling sequence for a duration $\Delta T_E$ such that:

$$\Delta T_E = N \times \delta t, \text{ where}$$

N is the maximum number of samples that can be acquired (see equation (3)). The duration $T_I$ of an optical pulse must then necessarily be less than $\Delta T_E$. The function of the optical gate 16 is to define a time window for application of the stream of pulses emitted by the source 7. Among other factors, this means that the saturable absorbent is no longer permanently illuminated.

According to one particular embodiment of the second variant of the invention (case in which the optical sampler includes a divider and a saturable absorbent), the four-port coupler 1, the waveguide that loops back onto the four-port coupler, the three-port coupler 2, the attenuator 4, the amplifier AMP and the divider 5 are integrated on a semi-conducting substrate with implanted wave guides. The attenuator 4 and the amplifier AMP are then made using a semi-conductor technology. In the framework of this particular embodiment, the compensator 15 for improvement of the invention is then composed of a Bragg network implanted on the waveguide.

Figure 7:
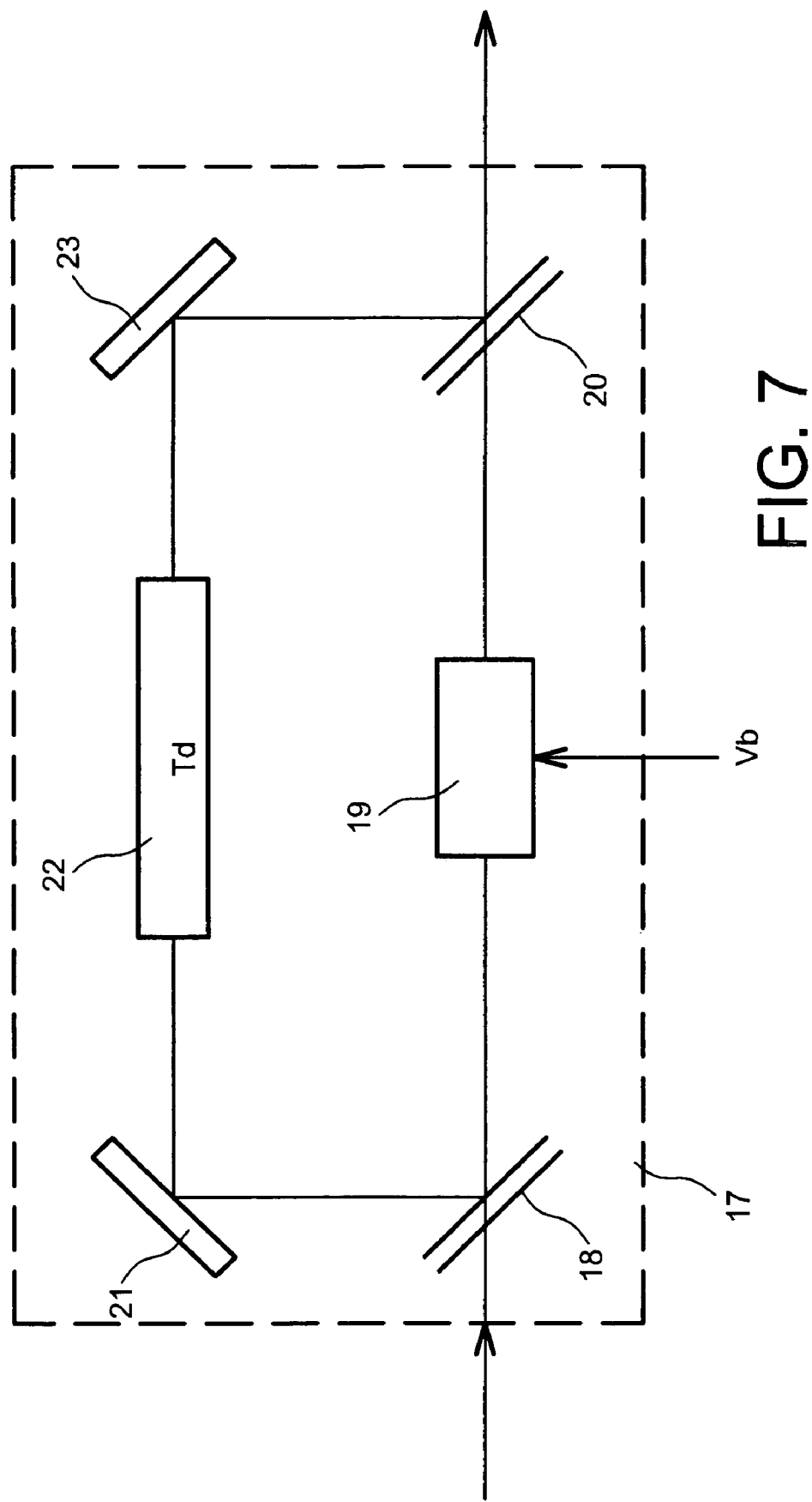
FIG. 7 shows a detailed view of a circuit in the measurement device according to the improvement shown in FIG. 6.
Figure 8A:
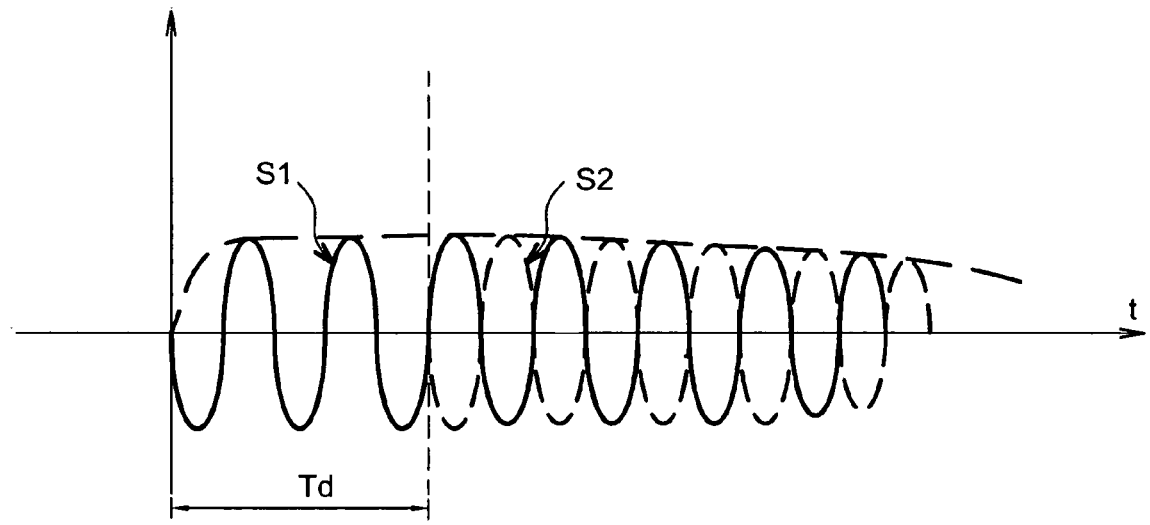
FIGS. 8A-8B show time diagrams illustrating operation of the circuit shown in FIG. 7.
Figure 8B:
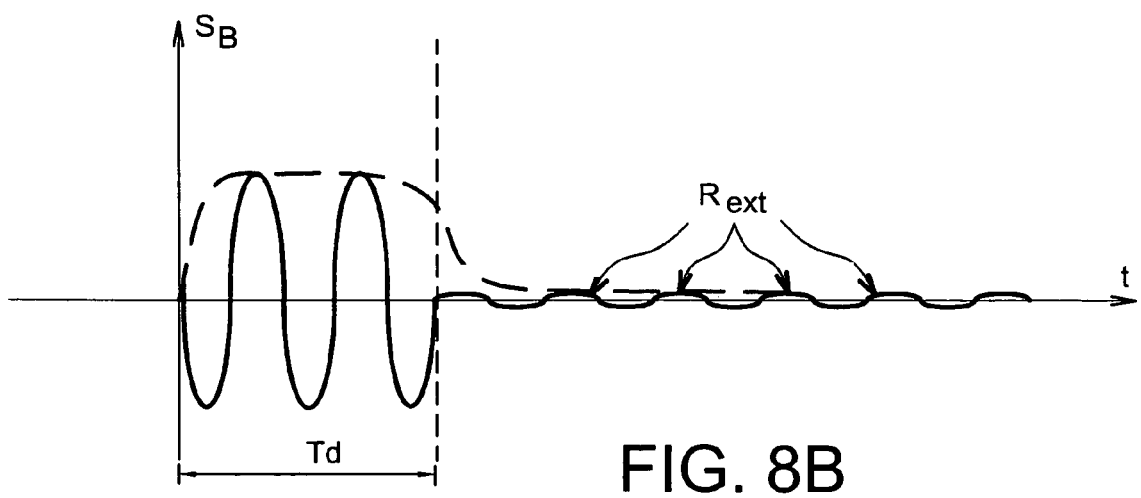

FIG. 7 shows the interferometric reshaping device 17 in the case of propagation in free space and FIGS. 8A and 8B show time diagrams that illustrate operation of the interferometric device 17.

The interferometric device 17 comprises a balanced separator 18, an adjustable delay circuit 19 by external polarization, a combiner 20, two mirrors 21, 23 and a fixed delay circuit 22 (delay $T_d$). The adjustable delay circuit 19 is controlled by a polarization voltage Vb. An optical sample Ei output by the optical sampler Ech is transmitted to the balanced separator 18. The balanced separator 18 then transmits a first sub-sample to the adjustable delay circuit 19 by polarization within a small range of values and a second sub-sample to the mirror 21. The sub-sample that is transmitted to the mirror 21 is reflected by this mirror and is transmitted to the second mirror 23 through the delay circuit 22. The mirror 23 reflects the sub-sample that it receives and transmits it to the combiner 20 that also receives the pulse sub-sample transmitted through the adjustable delay circuit 19 by polarization. The combiner 20 combines the two sub-samples that it receives and transmits a reshaped sample signal to the photodiode 8.

The delay circuit 22 creates a delay Td between the first sub-sample and the second sub-sample. The second sub-sample that passes through the delay circuit 22 is then retarded after the first sub-sample that passes through the delay circuit 19 by the quantity Td. When a sample signal arrives on a separator 18, and as long as the duration T has not elapsed, the signal output from the interferometric device 17 is then only composed of the first sub-sample that passes through the adjustable delay circuit 19. When the delay Td has elapsed, the signal output by the interferometric device 17 is composed of the combination of the first and second sub-samples (combiner 20). The adjustable delay circuit 19 is adjusted to a polarization voltage Vb equal to the half-wave voltage. The result is that the first and second sub-samples combine and are in phase opposition and destroy each other by interference. The signal output by the interferometric device 17 is then composed of a single sub-sample with duration Td, beyond which all that remains are small extinguishing residues $R_{ext}$ (residues of interference between the first and second sub-samples). FIG. 8B shows the signal $S_B$ output by the interferometric device 17. FIG. 8A shows the different signals that are combined to obtain the signal $S_B$ shown in FIG. 8B. The signal S1 shows the first sub-sample that passes through the circuit 19 and signal S2 shows the second sub-sample that passes through the delay circuit 22.

The interferometric device 17 is well adapted to monotonous quasi-exponential shaped decay profiles, such as the profiles characterizing the saturable absorbents transmission overlap phase (see FIGS. 8A-8B).

The delay value $T_d$ depends on the difference in the length of the optical path between the two arms of the interferometric device 17. It needs to be generally stable and precise. For an embodiment in free space, a delay circuit 22 can be made for example by a plate with a calibrated index and thickness, placed between the two reflection mirrors 21 and 23. The length of the medium is then chosen as a function of the value required for the duration $T_d$. In the case of a guided propagation, the interferometric device 17 may be integrated into a waveguide component implanted on an electro-optical substrate, for example in a technology similar to the technology used for telecommunications modulators.

As has already been mentioned, if there is no interferometric device 17, the time resolution is limited by the overlap time $T_{sat}$ of the saturable absorbent that then has to be as short as possible. Advantageously, the interferometric device 17 can be used to obtain sampling signal durations less than the overlap time $T_{sat}$. It is then possible, for example, to reduce the duration $T_{ech}$ of a value $T_{sat}$ between 1 and 5 ps to a value $T_d$ equal to a few hundreds of femtoseconds. The presence of the interferometric device 17 can significantly improve the limiting time resolution of the measurements, and consequently extend the field of application domains of the invention.

Apart from the fact that the shaping of the rear transition has to be very accurately adjusted to eliminate all signal residues after the rear transition, another phenomenon has to be taken into account: shaping done by the interferometric device modifies the energy balance. A specific calibration coefficient may be used to take account of the change to the shape of the signal. A prior calibration phase is then necessary.

Although not restrictive, a few characteristic figures can help to quantify basic magnitudes and the range of performances possible within the scope of the invention. Consider the case of standard SLM sources, where $T_{ML}$=100 to 200 fs and the loop time τ=10 ns (namely L=2 m) corresponding to the usual value Fo=100 MHz. The maximum number of samples is within the range N=$10^2$ to $10^3$ samples, to the extent that the amplifier 4 of the loop has a sufficient saturation power and that the output coupling ratio from the zone Z1 remains low. For example, a resolution value δt=3 ps on the profile of a pulse with duration $T_I$=3 ns requires N=1000 points. N is also the minimum memory depth necessary to save acquired samples. Assuming a complete configuration including the interferometric device 17, application and metrological performance domains covered by the invention can be estimated. In the current state of technology of optical components available on the market, for pulses with a duration $T_I$ that varies from a few tens of picoseconds to a few tens of nanoseconds, the following values give an overview of the expected performances; a range of time resolutions δt between 0.5 picoseconds and a few picoseconds, an amplitude coding range greater than or equal to 8 bits, a repetition ratio of the profile measurement between a single pulse and several gigahertz. Coding on 8 bits is compatible with the performances of commercial fibre amplifiers and standard photodiodes. At the moment, the best amplifiers have a noise factor F=4 to 5 dB. Fast electro-optical attenuators exist in different technologies integrated on wave guides, with response times very much shorter than 1 nanosecond and therefore compatible with control achieved by the slaving electronics. Typical photodiodes have a range of the order of 30 dB. For all these figures, compromises need to be evaluated as a function of metrological needs. For illumination needs at periods of one picosecond at the saturable absorbent, for example in the case of carbon nano-tubes for which total whitening takes place at about 10 MW/cm$^2$, it is also necessary to specify that they are well within the range of fluences possible using technologies for existing SML sources; at $F_0=100$ MHz and $P_{ML}=10$ MW peak/cm$^2$ corresponding to an energy per sampling laser pulse of 10 pJ on a 10 µm$^2$ section, namely an average source power equal to 1 mW.

Figure 9:
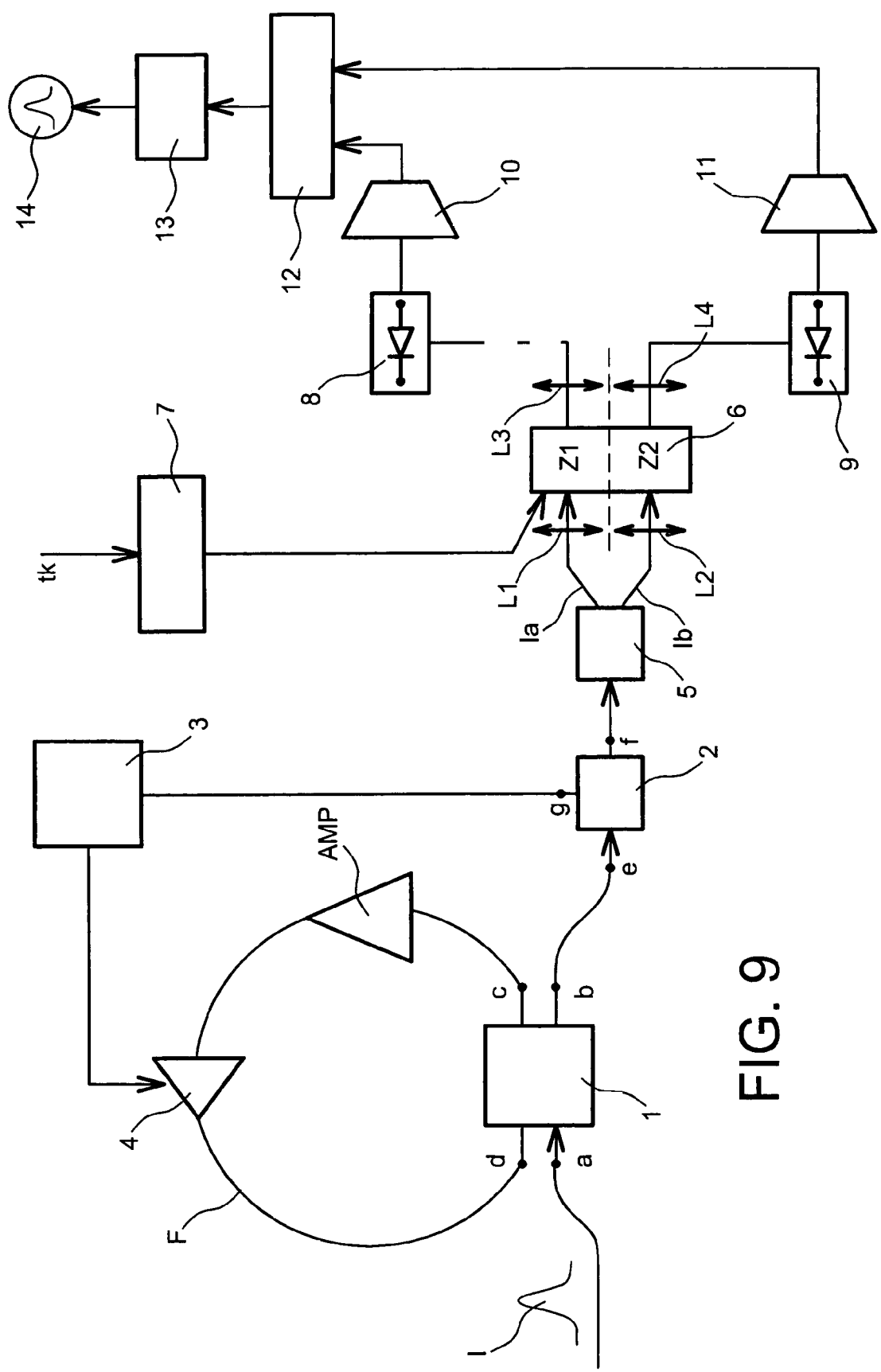
FIG. 9 shows another embodiment of the measurement device according to the invention.

FIG. 9 shows another embodiment of the measurement device according to the invention.

The measurement device comprises a four-port coupler 1, a single-mode type optical fibre F, a three-port coupler 2, a control circuit 3, an attenuator 4, an amplifier AMP, a divider by two 5, a saturable absorbent 6, a laser pulse source 7, two detectors 8, 9, two analogue/digital converters 10, 11, a differential circuit 12, a memory 13 and a display device 14.

Elements 1, 2, 3, 4, AMP, 5, 6 and 7 are connected to each other in the same way as above. In this case, the signal output by the zone Z1 of the absorbent is transmitted to a first detector 8 and the signal output by zone Z2 is transmitted to a second detector 9. Detectors 8 and 9 are preferably photodiodes for which the rise time may for example be included between about ten and a few hundred picoseconds. The photodiodes 8, 9 are placed behind the zones Z1 and Z2 in a collimated coupling configuration. Photodiodes 8 and 9 can for example operate within analogue frequency bands between 10 GHz and 60 GHz, as is currently authorized by telecommunication network technologies. Although it is not essential, integral transport on single-mode fibre is possible between the outputs from zones Z1 and Z2 and the corresponding detectors 8 and 9. Bandwidth constraints behind the sampling function are strongly relaxed and the electrical/optical conversion takes place in integrator mode.

The electrical pulses output by photodiodes 8 and 9 are transmitted to corresponding analogue-digital converters 10 and 11 respectively that digitally code the level of signals that they receive. For example, coding may be done on 8 to 10 bits. The coding time is not critical. It is only limited by the value of τ. The digitised data are then interpreted by calculation electronics (differential circuit 12), the role of which is to determine the difference ΔP between the signal output by the analogue-digital converter 10 and the signal output by the analogue-digital converter 11. The difference operation previously carried out optically is done digitally in this case.

Figure 10:
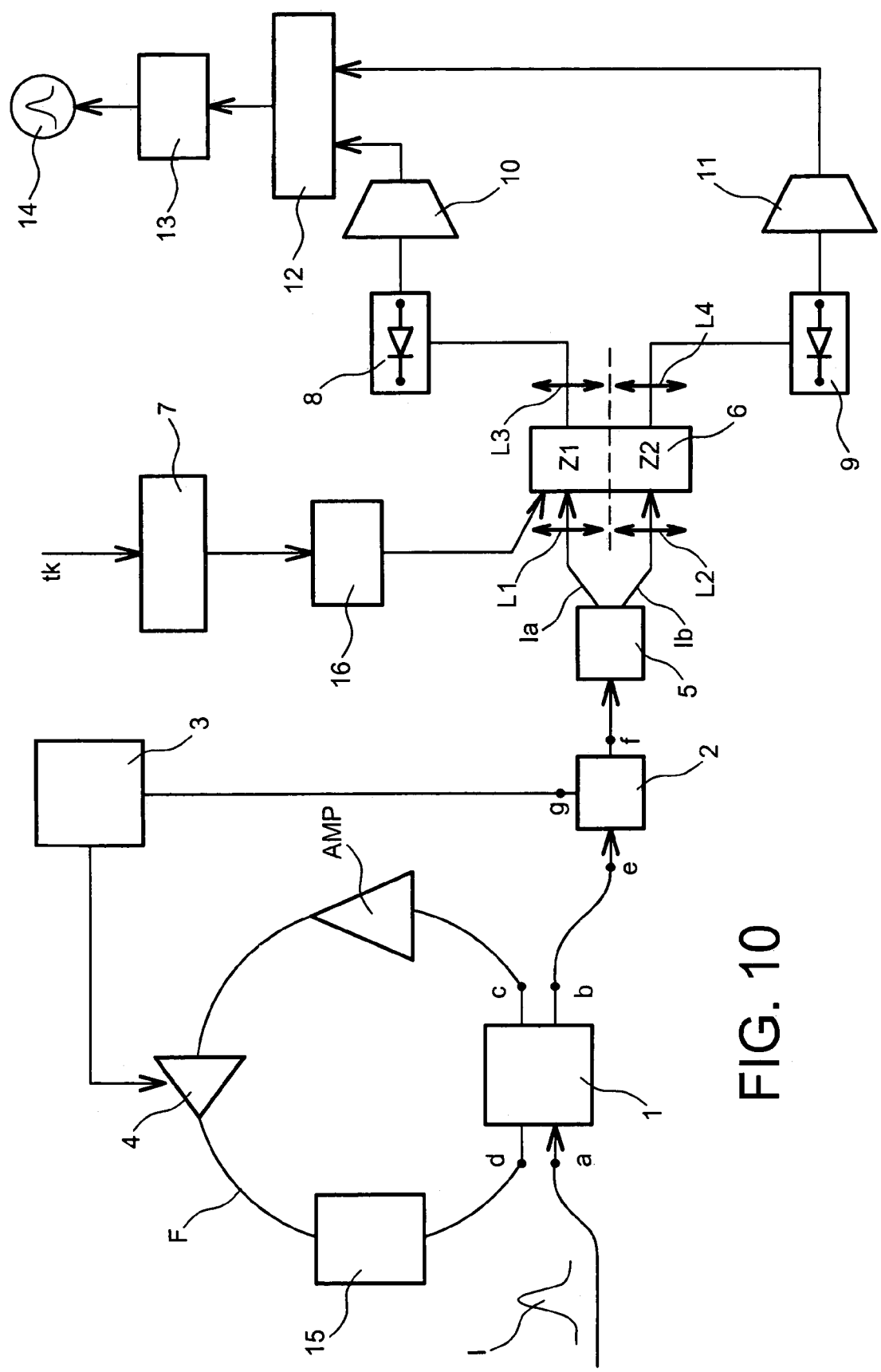
FIG. 10 shows an improvement to the measurement device shown in FIG. 9.

FIG. 10 shows an improvement to the measurement device shown in FIG. 9. In addition to the elements shown in FIG. 9, the measurement device comprises a compensator 15 and an optical window 16. The compensator 15 and the optical window 16 are placed at the same location as in the improvement previously shown in FIG. 6, and have the same advantages as before.

Advantageously, the invention is applicable not only to optical pulses but also to electrical pulses. In this case, it is simply necessary to convert the electrical pulse to be measured into an optical pulse. An electro-optical modulator is then placed on port a of the coupler 1 to achieve the conversion. The electro-optical modulator may be a direct modulation modulator or an indirect modulation modulator. If an indirect modulation modulator for which the widest passbands are possible is used, the modulator is powered at its input by a low power DC laser source. For a direct modulation, the modulator may for example be a diode. However, some degradation of frequency performances will have to be considered when measuring electrical pulses, since the transfer function of the electro-optical modulator is a limiting factor in terms of the analogue passband of the device. However, the time resolution of sampling is maintained.

Figure 11:
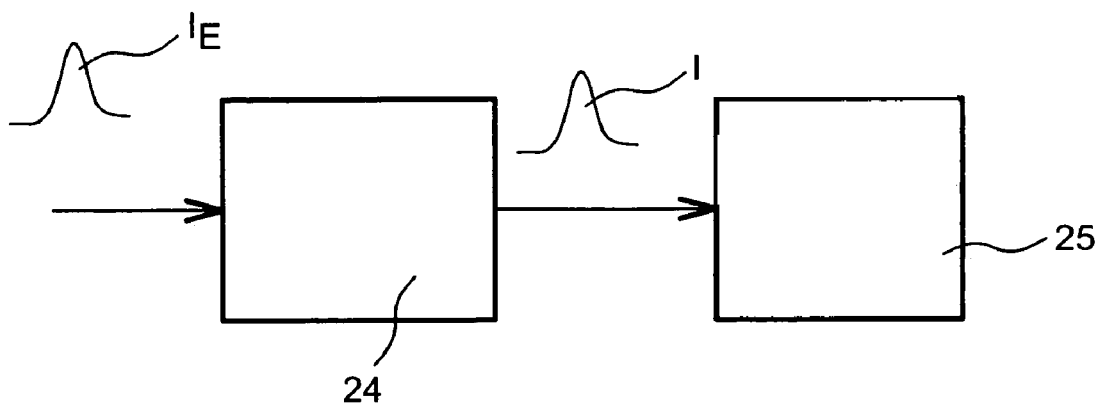
FIG. 11 shows a device for measuring a single electrical pulse according to the invention.

For example, the electro-optical modulator may be derived from electro-absorbent or polymer technologies, or a progressive wave modulator. FIG. 11 shows a device for measuring electrical pulses according to the invention. The device includes an electro-optical modulator 24 in series with a device 25 for measuring the profile of optical pulses according to the invention. The electro-optical modulator 24 converts an electrical pulse $I_E$ into an optical pulse I.

The invention claimed is:

1. Device for measuring the profile of very short single optical pulses or pulses with a low repetition rate, comprising replication device configured to create a series of replica pulses of the initial optical pulse, with period τ starting from an initial optical pulse a slaving device configured to adjust the amplitudes of replica pulses to values approximately the same as each other, an optical sampling device configured to sample replica pulses to output optical samples starting from the replica pulses, and a detector configured to form an electrical signal from optical samples output by the optical sampling device, the optical sampling device comprising a laser source that emits laser pulses with a frequency 1/To and with a very much shorter duration than the initial optical pulse, the period τ of the replica pulses and the period To of the laser pulses being related by the relation:

τ=To−δt, where

δt is a time drift with a very significantly shorter duration than the initial optical pulse duration, and an optical sampler illuminated by the replica pulses and by the laser pulses, said device for measuring being characterised in that said replication device comprises an optical fibre loop and an amplifier in said loop, said optical sampler comprises a divider to divide a replica pulse into a first replica pulse fraction and a second replica pulse fraction, a saturable absorbent comprising a first zone and a second zone, illuminated by the first and second replica pulse fractions respectively, the first zone being made approximately transparent under the effect of laser pulses, and an interferometric optical subtraction device that outputs an optical sample as the result of the difference between a sampled signal output from the first saturable absorbent zone and a signal output from the second saturable absorbent zone.

2. Device according to claim 1, characterised in that the interferometric optical subtraction device comprises a first arm with an input to collect the sampled signal output from the first zone, a second arm to collect the signal output from the second zone, a phase shifter, installed in series on the second arm in order to set a phase shift Π between the optical signal output from the first arm and the optical signal output from the second arm, and a junction with two inputs and one output that collects the signal output from the first arm on a first input and the signal output from the second arm on a second input, and that outputs the optical sample on its output.

3. Device according to claim 1, characterised in that the saturable absorbent is a colouring agent-based liquid solution.

4. Device according to claim 1, characterised in that the saturable absorbent comprises carbon nano tubes.

5. Device according to claim 1, characterised in that the saturable absorbent is an absorbent with semi-conductors.

6. Device according to claim 1, characterised in that it comprises an interferometric device installed at the output from the optical sampler to reduce the width of the optical samples.

7. Device according claim 6, characterised in that the interferometric device comprises:

a balanced separator which divides an optical sample into a first sub-sample and a second sub-sample, a first arm which comprises a first mirror, a second mirror and a delay circuit located between the first mirror and the second mirror to form a first optical path for the first sub-samples;

a second arm which comprises an adjustable delay circuit by external polarisation and polarised to a polarisation voltage substantially equal to a half-wave voltage to form a second optical path for the second sub-samples, and a combiner to combine the first and second sub-samples which propagate on the first and the second arms respectively.

8. Device according to claim 1 the replication device comprises a four-port coupler, the four-port coupler comprising two input ports and two output ports, a first input port forming the input through which the initial optical pulse enters the measurement device and a first output port forming the output through which replica pulses are output, the optical fibre connecting the second output port (c) to the second input port (d).

9. Device according to claim 8, characterised in that the slaving comprises, in addition to said amplifier, a three-port coupler of which one input port is connected to the output through which the replica pulses are output, a control circuit, an amplifier, and an attenuator, installed in series with said amplifier on the fibre guide, the three-port coupler enabling sampling of a replica pulse fraction to transmit the said replica pulse fraction to the control circuit which delivers a control signal depending on the amplitude of the replica pulse fraction sampled, the control signal being applied to the attenuator in the same way as for an electrical control.

10. Device according to claim 8, characterised in that the optical fibre is a single-mode fibre.

11. Device according to claim 10, characterised in that said replication device comprises a dispersion compensator installed in series on the single-mode fibre.

12. Device according to claim 11, characterised in that the compensator is a chirped Bragg network.

13. Device according to claim 11, characterised in that the compensator is a fibre segment for which the dispersion coefficient is opposed to the dispersion coefficient of the other components of said replication device.

14. Device according to claim 9, characterised in that the four-port coupler, the optical fibre, the three-port coupler, the attenuator, the amplifier and the divider are integrated on a semi-conducting substrate with implanted wave guides.

15. Device according to claim 14, characterised in that it comprises a dispersion compensator formed from a Bragg network implanted in series on the wave guide.

16. Device according to any one of the previous claims, characterised in that it comprises an optical window located on the path of the laser pulses, between the laser pulse source and the optical sampler.

17. Device according to claim 1, characterised in that the detector comprises at least a photodiode in series with an analogue/digital converter.

18. Device according to claim 17, characterised in that the analogue/digital converter is a converter on 8 or 10 bits.

19. Device according to claim 17, characterised in that it comprises a memory which stores the signals output by the analogue/digital converter.

20. Device according to claim 1, characterised in that the laser pulse source is a mode blocking source.

21. Device for measuring the profile of single electrical pulses or pulses with a low repetition rate, characterised in that it comprises an electro-optical modulator in series with a device for measuring the profile of optical pulses according to claim 1.

22. Device for measuring single electrical pulses according to claim 21, characterised in that the electro-optical modulator is an indirect modulation modulator.

23. Device for measuring single electrical pulses according to claim 21, characterised in that the electro-optical modulator is a direct modulation modulator.

24. Device for measuring single electrical pulses according to claim 23, characterised in that the electro-optical modulator is a diode.

* * * * *